US006181320B1

(12) United States Patent
Fredrickson

(10) Patent No.: US 6,181,320 B1
(45) Date of Patent: Jan. 30, 2001

(54) METHOD FOR CONVERTING TIMING DIAGRAM INTO TIMING GRAPH AND VICE VERSA

(75) Inventor: Mark S. Fredrickson, Rochester, MN (US)

(73) Assignee: International Business Machines Corporation, Armonk, NY (US)

( * ) Notice: Under 35 U.S.C. 154(b), the term of this patent shall be extended for 0 days.

(21) Appl. No.: 09/136,473

(22) Filed: Aug. 19, 1998

(51) Int. Cl.[7] ....................................................... G09G 5/36

(52) U.S. Cl. .............................................. 345/134; 703/14

(58) Field of Search ................................... 345/133, 134, 345/440; 703/14, 15, 19; 702/66, 67

(56) References Cited

U.S. PATENT DOCUMENTS

| | | |
|---|---|---|
| 4,641,348 | 2/1987 | Neuder et al. . |
| 4,809,189 | 2/1989 | Batson . |
| 5,081,592 | 1/1992 | Jenq . |
| 5,515,487 | 5/1996 | Beaudet et al. . |
| 5,611,034 | 3/1997 | Makita . |
| 5,713,031 | 1/1998 | Saito . |
| 5,745,386 | 4/1998 | Wile et al. . |

OTHER PUBLICATIONS

Viktor Cingel, A Graph–Based Method for Timing Diagrams Representation and Verification, pp. 1–14 (No Date Available).

Viktor Cingel and Norbert Fristacky, Formal Reasoning on Timing at the Timing Diagram Level, *Computers and Artificial Intelligence,* pp. 495–520, vol. 13, 1994.

Christina Antonine, Bernard Le Goff and Jean–Eric Pin, A Graphic Language Based on Timing Diagrams, *Sadhana,* pp. 125–145, vol. 21, Part 2, Apr. 1996.

Erwin W. Thruner Formal Description of Bus Interfaces Using Methods of System Theory, pp. 190–202.

Bachiner Berkane, et al. Algebra of Communicating Timing Charts for Describing and Verifying Hardware Interfaces, pp. 114–133, IFIP 1997, Published by Chapman & Hall.

Cheryl Dietz, Graphical Formalization of Real–Time Requirements, pp. 366–384.

E. M. Thurner, Proving System Properties by Means of Trigger–Graph and Petri Nets, pp. 88–102.

http://www.viewlogic.com/products/Motive.html, *Motive* (5 pgs).

Richard B. Watson, Jr. and Russell B. Iknaian, ISSCC95/Session6/Digital Design Elements: Paper TA 6.2, 1995 IEEE (2pgs).

James J. Cherry, Pearl: A CMOS Timing Analyzer, pp. 148–153, 25th ACM/IEEE Design Automation Conference, 1988 IEEE, Paper 12.2.

Cadence Design Systems, Inc., Marketing Services, *Pearl Datasheet,* 1997.

Mark S. Fredrickson, Interactive Timing Diagrams and the Timing Diagram Markup Language (TDML) (10 pgs), May 28, 1998.

*Primary Examiner*—Regina Liang
(74) *Attorney, Agent, or Firm*—Lawrence D. Maxwell

(57) ABSTRACT

A computer-implemented method and computer program product or software tool for converting a timing graph produced by a static timing engine into a timing diagram and vice versa may be integrated with a static timing analysis tool or may be a stand-alone product. The timing graph is represented by a data structure having nodes that correspond to actual circuit nodes of a circuit simulated by the timing engine and arcs connecting the nodes that correspond to temporal relationships between points on the timing diagram waveforms, such as points at which state transitions occur. To convert a timing graph to a timing diagram, the data structure is traversed from node to node. State transitions are extracted from each node, and temporal relationships between the signals are extracted from each arc. A graphical representation of the timing diagram is then displayed. Alternatively, the timing diagram is output in a suitable file format, such as Timing Diagram Markup Language (TDML). The steps can be reversed to convert a timing diagram into a timing graph.

10 Claims, 6 Drawing Sheets

METHOD FOR CONVERTING TIMING DIAGRAM INTO TIMING GRAPH AND VICE VERSA

BACKGROUND OF THE INVENTION

1. Field of the Invention

The present invention relates generally to electronic design automation (EDA) and, more specifically, to EDA software tools relating to the use of timing diagrams to represent the input or output of a static timing engine.

2. Description of the Related Art

Logic simulation engines are software tools that a circuit design engineer may use to simulate the operation of a circuit. The tool may include a component that parses a netlist file representing a schematic diagram of the circuit and uses the resulting information about the circuit as input data for the simulation engine. Alternatively, or in addition, the tool may include a component that parses a hardware description language, such as Verilog™ or VHDL. The parser also refers to models of the various circuit devices or components, and these models include data relevant to the operation of the component, such as minimum set-up times required between changes in one input signal relative to another, minimum hold times required for inputs to remain steady, and minimum and maximum output delay times for the device to respond to the changes in its inputs. The tool may output the results of the logic simulation in the form of waveforms displayed on the video screen for the circuit design engineer to evaluate. A waveform is a graphical or visual representation of the manner in which a signal in the circuit changes with time. In other words, a waveform may indicate the transitions between logic states and the times at which they occur, relative to some reference time or relative to other displayed waveforms. Certain tools not only can generate waveforms as output data from a simulation but also can accept waveforms as input data to a simulation.

A timing diagram includes, in addition to a waveform, relationships between state transitions of different signals. For example, a timing diagram may not only display a clock waveform, a data waveform, and an output waveform, but may also indicate a set-up time between a transition or edge of the clock waveform and a transition of the input data waveform to valid input data, a delay time between the clock edge transition and transition of the output data waveform to valid output data, and a hold time between between another transition or edge of the clock waveform and a transition of the input data waveform back to invalid or potentially invalid data. A timing diagram typically indicates these relationships with dimension lines, arrows or similar graphics.

A standard language referred to as Timing Diagram Markup Language (TDML) has recently been proposed for communicating and storing timing diagrams in electronic format. The proposed TDML standard is available from the TDML Working Group of the Silicon Integration Initiative (Si2) organization, which operates as Si2, Inc. based in Austin, Tex. The TDML project is part of Si2's Electronic Component Information Exchange (ECIX) project. TDML is based on the Standard Generalized Markup Language (SGML), ISO 8879:1986. The goal behind defining TDML as a standard language supported by an appropriate standards organization such as ISO is to allow electronic component manufacturers to make computer-readable technical information relating to their products available to users via the Internet or similar means. A circuit design engineer could thus remotely retrieve the TDML files describing the operation of components of a circuit he or she wishes to simulate, and provide the TDML files directly as inputs to the simulation engine. Currently, such information must be read from data books published by the manufacturer either in print or electronically and then manually converted into component models readable by the simulation engine.

While commercially available logic simulation tools commonly use waveforms as input and output data, few such tools currently use timing diagrams. Logic simulation tools that provide output data in the form of timing diagrams are sometimes referred to as timing diagram tools. Their simulation engines operate by performing computations on data arrays or matrix-like data structures that represent a model of the circuit under simulation. The contents of the data structure is typically displayed in a spreadsheet-like manner in a window, while the timing diagrams are displayed in another window.

Another type of simulation engine that is widely used in commercially available EDA tools is sometimes referred to as a static timing engine. A static timing engine operates by performing computations on directed graph data structures using algorithms grounded in graph mathematics. In one common form of this data structure, the nodes of the graph represent nodes of the circuit at which the signals exist. The connections between the nodes (often referred to as arcs or segments, particularly in the context of a visual representation of a graph) represent the physical connections between the circuit nodes. Associated with each connection or arc is information regarding the temporal relationship of events that occur at the circuit node referenced by each end of the arc. Typical relationships include delays, set-up time requirements, hold time requirements, and pulse-width requirements. Note that an arc may exist between a node and itself and include associated information regarding the temporal relationship between two events that occur at that circuit node.

Tools that use static timing engines typically produce output in the form of text reports. The report can be a list of all nodes in the circuit under simulation, the signal transitions that occurred at each node, the times at which they occurred relative to a starting or reference time, and relationships between the transitions of certain signals and the transitions of certain other signal. Circuit design engineers have been known to manually convert such timing graph text reports into timing diagrams.

It has been suggested in the art to convert a certain type of timing graph into a timing diagram, but in that type of timing graph the nodes represent events, i.e., signal transitions. They do not represent signal nodes in the actual circuit. One commercially available tool that automates such conversion is PEARL, produced by Cadence Design Systems, Inc. of San Jose, Calif.

It would be desirable to provide a software tool that converts the type of timing graph in which nodes represent actual circuit nodes into timing diagrams and vice versa. This object and others are satisfied by the present invention in the manner described below.

SUMMARY OF THE INVENTION

The present invention relates to a computer-implemented method and computer program product or software tool for converting a timing graph produced by a static timing engine into a timing diagram and vice versa. The program product may be integrated with a static timing analysis tool or may be a stand-alone product. The timing graph is represented by a data structure having nodes that correspond to actual circuit nodes of a circuit simulated by the timing engine and arcs connecting the nodes that correspond to temporal relationships between state transitions or other events at the actual circuit nodes of the simulated circuit. The data structure may have any suitable structure and be implemented in any suitable computer programming language; the terms "nodes" and "arcs" are used for convenience herein and do not denote any programming-specific software structures. Preferably, the data structure is one that is defined by a suitable commercially available static timing analysis tool, such as the EinsTimer™ static timing analysis tool produced by IBM Corporation.

To convert a timing graph to a timing diagram, the data structure is traversed from node to node to identify nodes of interest and arcs of interest. Prior to beginning the conversion method, the user may identify these sets of nodes of interest and arcs of interest. The signal at each node of interest is one that the user would like to see represented by a displayed waveform. Similarly, each arc of interest represents a relationship between points on waveforms that the user would like to see displayed. Alternatively, the set of nodes of interest and/or arcs of interest may be non-user-selectable; e.g., the set may be predefined to include all nodes and all arcs of the circuit under simulation.

At each node of interest that is located, data representing a set of state transitions is extracted. This set of transitions are those of signals present at an actual circuit node corresponding to the node of interest. Similarly, at each arc of interest data representing a set of temporal relationships between the signals is extracted.

A graphical representation of the waveform corresponding to the signal at each node of interest is displayed. The waveform thus visually reflects the set of state transitions extracted from the node. Similarly, graphical representations of the temporal relationships between points on the waveforms are displayed. The temporal relationships may include, for example, set up times, hold times, and signal path delays. The combined graphical representations of the waveforms and relationships thus define a timing diagram.

An alternative step to displaying a graphical representation of the timing diagram is to generate software code that represents the timing diagram. Suitable languages have been proposed, such as that which is currently referred to as Timing Diagram Markup Language (TDML), which have a syntax that defines waveform state transitions and temporal relationships between points on the waveforms. The generated code can thus be conveniently stored, communicated to a remote location, analyzed or otherwise converted into a graphical representation of the timing diagram at a remote time and/or place.

The above-described steps can be reversed to convert a timing diagram into a timing graph. Although a graphical representation of a timing diagram can be parsed to identify state transitions and temporal relationships, it is preferred that software code reflecting the timing diagram be parsed instead. The state transitions and data representing the temporal relationships are then stored in a data structure of the type described above.

The foregoing, together with other features and advantages of the present invention, will become more apparent when referring to the following specification, claims, and accompanying drawings.

BRIEF DESCRIPTION OF THE DRAWINGS

For a more complete understanding of the present invention, reference is now made to the following detailed description of the embodiments illustrated in the accompanying drawings, wherein.

DESCRIPTION OF PREFERRED EMBODIMENTS

Figure 1:
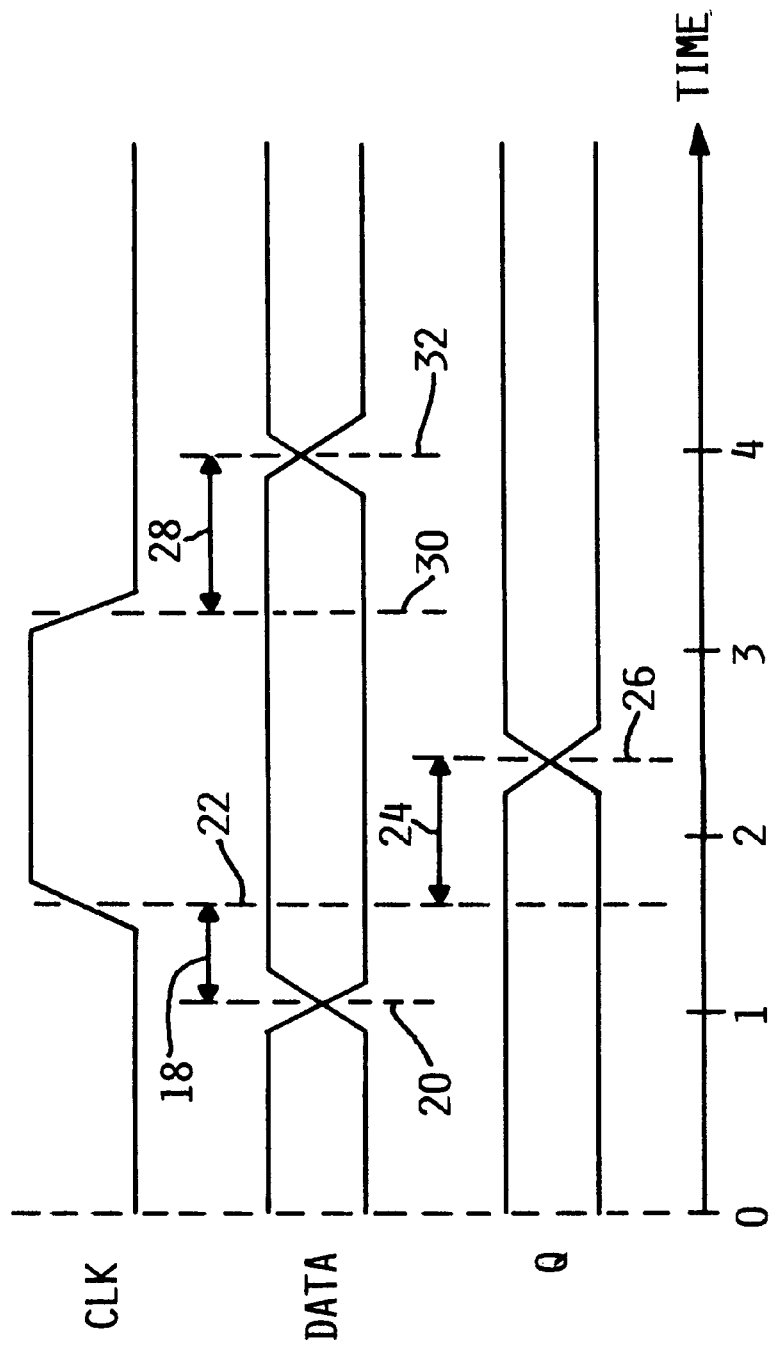
FIG. 1 illustrates an exemplary timing diagram of the type known in the art.
Figure 2:
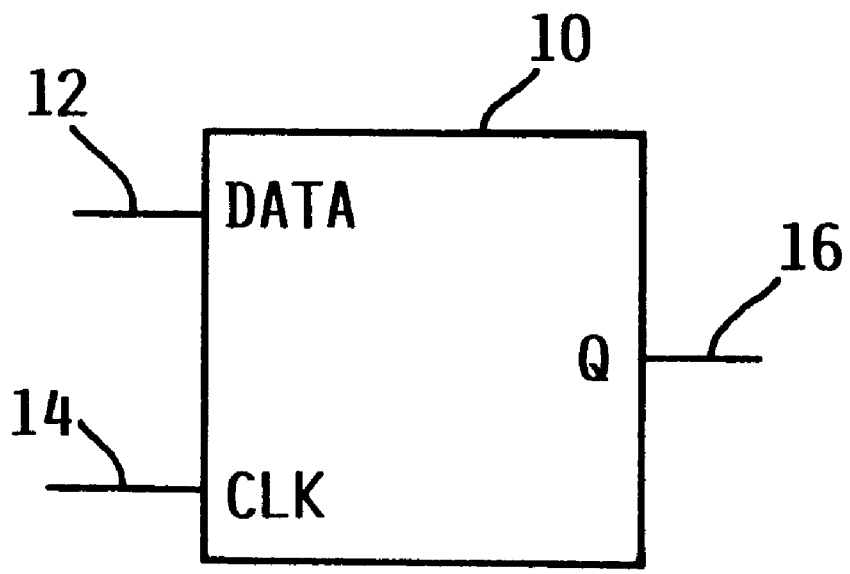
FIG. 2 illustrates an electronic component of the type known in the art.

A conventional (prior art) timing diagram, such as the exemplary timing diagram illustrated in FIG. 1, can be used to illustrate the operation of one or more circuits, such as the exemplary circuit component or device 10 illustrated in FIG. 2. Like any timing diagram, the timing diagram of FIG. 1 includes not only the waveforms themselves but also indications of the temporal relationships between points on the waveforms, such as set-up times, hold times, and delay times. Device 10 has a data input 12 that receives a "DATA" signal, a clock input 14 that receives a "CLK" signal, and a data output 16 that produces a "Q" signal in response to the DATA and CLK signals. The timing diagram illustrates that a set-up time 18 exists between a change in state of the DATA signal occurring at a point in time 20 and a change in state (a rising edge) of the CLK signal occurring at a point in time 22. It also illustrates that a delay time 24 exists between point 22 and a point 26 at which a change in state of the Q signal occurs. It further illustrates that a hold time 28 exists between a subsequent change in state (a falling edge) of the CLK signal occurring at a point in time 30 and a subsequent change in state of the DATA signal occurring at a point 32. Also, each of these changes in state is not instantaneous but rather occurs over some time interval, which is known as a slew time. The significance of the terms "set-up time," "delay time," and "hold time" are well-understood by persons skilled in the art and are not described in further detail herein. It should be noted, however, that set-up time 18 and hold time 28 may represent, for example, the minimum set-up and hold times required for proper operation of device 10, and delay time 24 may represent the maximum delay time of device 10, as specified by the manufacturer of device 10. Such operational characteristics of electronic devices are typically specified by their manufacturers in data books.

The following software code listing corresponds to the timing diagram of FIG. 1 and is written in a Timing Diagram Markup Language (TDML)-like pseudocode:

```
diagram_unit=ns;
diagram_waveform_list
{
    CLK{rise=1.625, fall=2.875, riseslew=0.250, fallslew=0.250 }
    DATA{  risevalid=0.975, fallvalid=0.975,
           risevalidslew=0.125, fallvalidslew=0.125,
```

```
            riseinvalid=3.625, fallinvalid=3.8125,
            riseinvalidslew=0.250, fallinvalidslew}
   Q{  risevalid=(CLK(rise) + Delay(CLK(rise)->Q(risevalid))),
       fallvalid=(CLK(rise) + Delay(CLK(rise)->Q(fallvalid))),
       risevalidslew=(CLK(riseslew) + Delayslew(CLK(rise)->
       Q(risevalid))),
       fallvalidslew=(CLK(riseslew) + Delayslew(CLK(rise)->
       Q(fallvalid))) }
}
diagram_relationship_list
{
   Delay (CLK(rise)->Q(risevalid))=0.750;
   Delay (CLK(rise)->Q(fallvalid))=0.750;
   Delayslew(CLK(rise)->Q(risevalid))=0.000;
   Delayslew(CLK(rise)->Q(fallvalid))=0.000;
   Setup(CLK(rise)->DATA(risevalid))=0.000;
   Setup(CLK(rise)->DATA(fallvalid))=0.000;
   Hold(CLK(fall)->DATA(riseinvalid))=0.000;
   Hold(CLK(fall)->DATA(fallinvalid))=0.000;
}
```

Figure 3:
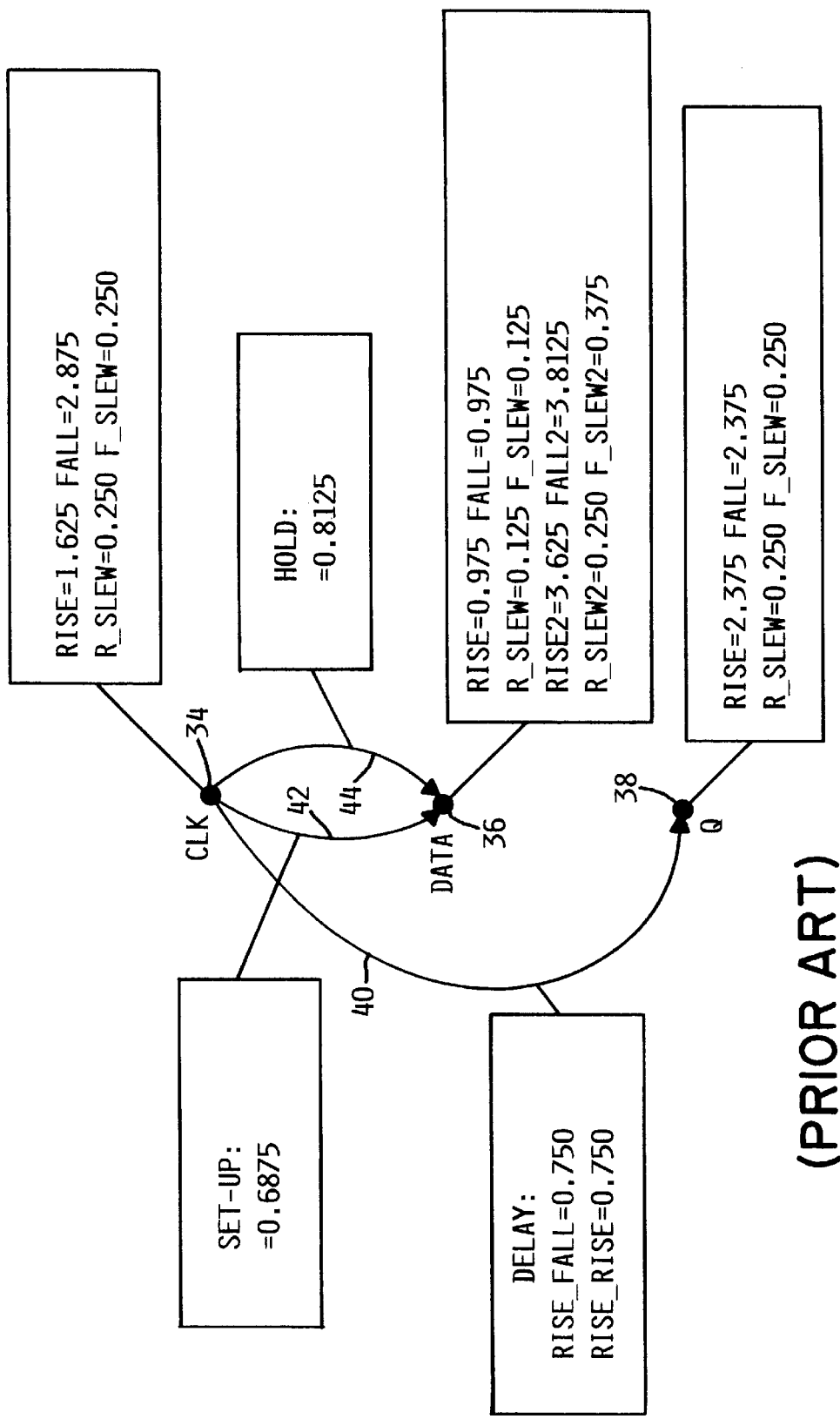
FIG. 3 illustrates a timing graph of the type known in the art.

As illustrated in FIG. 3, the timing diagram of FIG. 1 can equivalently be represented by a timing graph of the type conventionally used in static timing engines. In this type of timing graph, each node of the graph corresponds to an actual location in the circuit at which a signal can exist. For example, in the timing graph of FIG. 3, a CLK node 34 corresponds to clock input 14 of device 10; a DATA node 36 corresponds to data input 12 of device 10; and a Q node 38 corresponds to data output 16 of device 10.

As indicated by the box associated with CLK node 34, CLK node 34 contains the following information describing the state transitions of the CLK signal that exists at clock input 14: a rising edge (RISE) occurs at time 1.625; a falling edge (FALL) occurs at time 2.875; the rising edge has a slew time (R_SLEW) of 0.250; and the falling edge has a slew time (F_SLEW) of 0.250. These values are relative to the scale of the time axis illustrated in FIG. 1 and are chosen solely for purposes of illustration. The scale may be nanoseconds or other convenient units, and the zero on this scale may be at any suitable location. Also, as indicated by the box associated with DATA node 36, DATA node 36 contains the following information describing the state transitions of the DATA signal that exists at data input 14: a rising edge (RISE) occurs at time 0.975; a falling edge (FALL) occurs at time 0.975; the rising edge has a slew time (R_SLEW) of 0.125; and the falling edge has a slew time (F_SLEW) of 0.125; a second rising edge (RISE2) occurs at time 3.625; a second falling edge (FALL) occurs at time 3.8125; the second rising edge has a slew time (R_SLEW2) of 0.250; and the second falling edge has a slew time (F_SLEW2) of 0.375. Similarly, as indicated by the box associated with Q node 38, Q node 38 contains the following information describing the state transitions of the Q signal that exists at data output 16: a rising edge (RISE) occurs at time 2.375; a falling edge (FALL) occurs at time 2.375; the rising edge has a slew time (R_SLEW) of 0.250; and the falling edge has a slew time (F_SLEW) of 0.250.

Also, in this type of timing graph, each arc, i.e., the connection between two nodes or between a node and itself, corresponds to a temporal relationship between points on two waveforms. The relationships may be constraint relationships or may be propagation or delay relationships. In this example, the timing graph includes a CLK->Q arc 40, a CLK->DATA arc 42, and a CLK->DATA arc 44.

As indicated by the box associated with the CLK->Q arc 40, CLK->Q arc 40 contains the following information describing the propagation relationship between the CLK signal that exists at clock input 14 and the Q signal that exists at output 16: a delay between the rising edge of the CLK signal and the failing edge of the Q signal (RISE_FALL) of 0.750, and a delay between the rising edge of the CLK signal and the rising edge of the Q signal (RISE_RISE) of 0.750. This propagation relationship corresponds to delay time 24. Also, as indicated by the box associated with CLK->DATA arc 42, CLK->DATA arc 42 contains the following information describing the constraint relationship between the CLK signal at clock input 14 and the DATA signal at input 12: a set-up time (SET UP) of 0.6875. Similarly, as indicated by the box associated with CLK->DATA constraint relationship 44, CLK->DATA arc 44 contains the following information describing the constraint relationship between the CLK signal at clock input 14 and the DATA signal at input 12: a hold time (HOLD) of 0.8125.

Although the above-described concept of a timing graph having nodes and arcs that contain information is useful in itself as an abstract concept, it is also known to embody such a graph in a computer data structure using suitable software. Commercially available static timing engines, such as the such as that of the EinsTimer™ static timing analysis tool produced by IBM Corporation, define and use such data structures. The mariner in which such a data structure can be defined and used is well-known to persons of skill in the art and therefore is not described herein in detail. Nevertheless, the following code listing in the C programming language defines an exemplary timing graph data structure:

```
typedef struct   _signal_data
{
   char*      signal_name;
   TIME       earliest_rise;
   TIME       earliest_fall;
   TIME       latest_rise;
   TIME       latest_fall;
   TIME       earliest_rising_slew;
   TIME       earliest_falling_slew;
   TIME       latest_rising_slew;
   TIME       latest_falling_slew;
}SIGNAL_DATA
typedef struct   _arc_delays
{
   /* rising/falling delays and slew effects go here. */
}ARC_DELAYS
typedef struct   _arc_tests
{
   /* setup, hold, pulsewidth tests, etc. go here. */
}ARC_TESTS
typedef struct   _prop_arc_data
{
   struct  _node_data*      source_node;
   struct  _node_data*      sink_node;
   struct  _arc_delays*     delays;
   TRIG_FLAG                trigger flag;
}PROP_ARC_DATA
typedef struct   _test_arc_data
{
   struct  _node_data*      source_node;
   struct  _node_data*      sink_node;
   struct  _arc_tests*      tests;
}TEST_ARC_DATA
typedef struct   _signal_list
{
   struct  _signal_list*    next_signal;
   struct  _signal_list*    prev_signal;
   struct  _signal_data*    signal_data;
}SIGNAL_LIST
typedef struct   _prop_arc_list
{
   struct  _prop_arc_list*  next_prop_arc;
```

```
                                     -continued
  struct   __prop_arc_list*       prev_prop_arc;
  struct   __prop_arc_data*       prop_arc_data;
}PROP_ARC_LIST
typedef struct   __test_arc_list
{
  struct   __test_arc_list*       next_test_arc;
  struct   __test_arc_list*       prev_test_arc;
  struct   __test_arc_data*       test_arc_data;
}TEST_ARC_LIST
typedef struct   __node_data
{
  struct   __signal_list*         signals;
  struct   __prop_arc_list*       incoming_prop_arcs;
  struct   __prop_arc_list*       outgoing_prop_arcs;
  struct   __test_arc_list*       incoming_test_arcs;
  struct   __test_arc_list*       outgoing_test_arcs;
  const char*                     node_name;
  node_type_type                  node_type;
  node_loc_type                   node_location;
  int                             is_clock;
}NODE_DATA;
```

During operation, i.e., simulation of a circuit, the timing engine creates an instance of the data structure in the memory of the computer system and populates the nodes and arcs with information generated during the simulation and information retrieved from component models describing the operational characteristics of the devices (e.g., device 10) in the circuit under simulation. The component models are typically provided in libraries prior to the simulation. A person typically creates a component model by reading a data sheet or book provided by the manufacturer or by performing some analysis of the temporal characteristics of the component, and writing software code in a suitable language that describes the operational characteristics in a format usable by the simulation engine. IBM's Delay Calculation Language (DCL) is a well-known example of such a language. The user also provides a set of initial conditions to the timing analysis engine, describing the transition times of the input signals. During the simulation, the timing analysis engine traverses the graph from one node to another and computes the propagation of the signals through the circuit. The algorithms defining the manner in which the engine traverses the graph and computes the propagation are grounded in graph-based mathematics and are not directly relevant to the present invention. It should be noted, however, that powerful and advanced timing analysis engines such as EinsTimer™ use timing graphs rather than some other structure, such as a matrix-like structure, principally because graph-based algorithms enable such structures to be efficiently traversed from one node to another.

Figure 4:
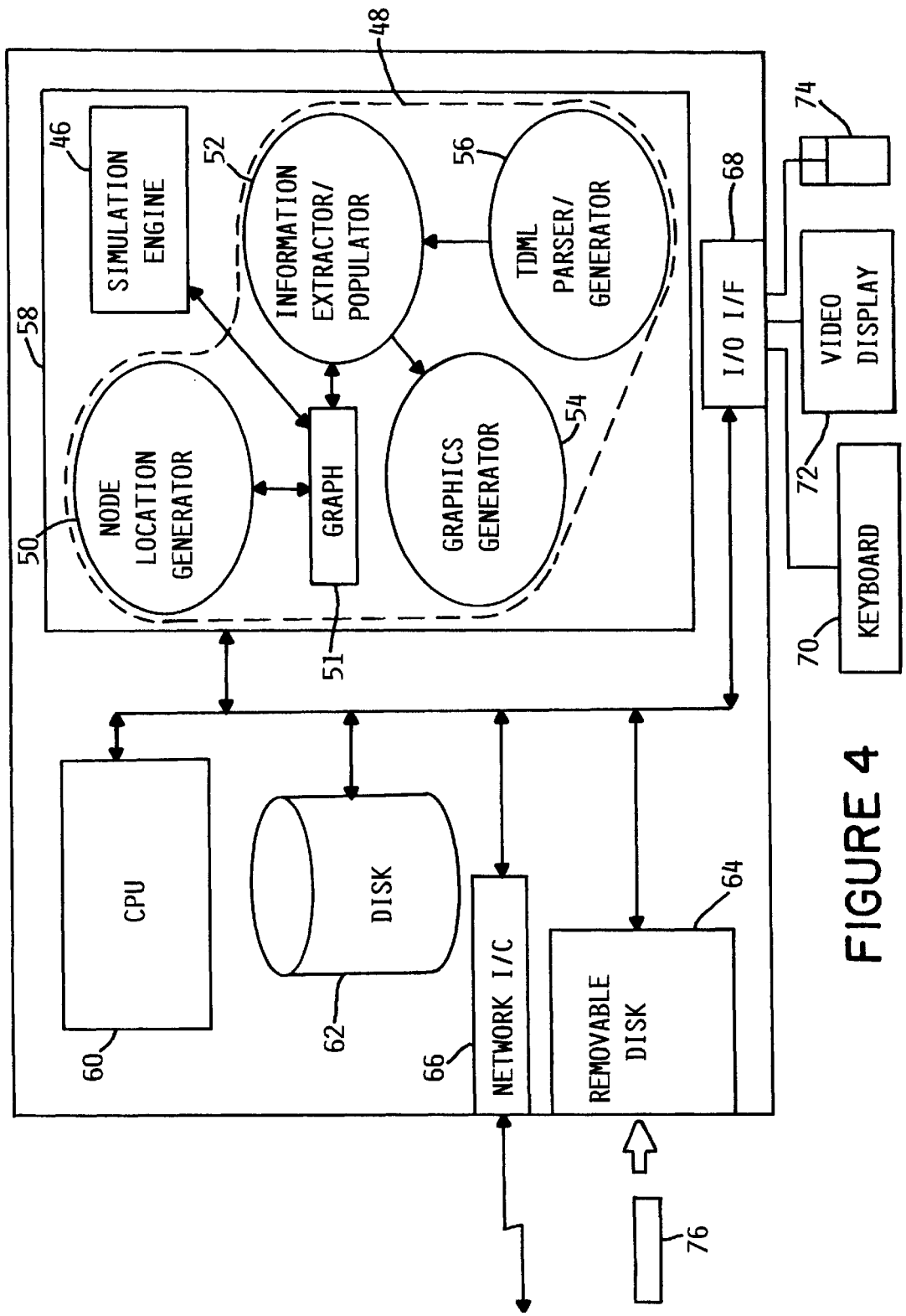
FIG. 4 is a block diagram of a programmed computer system having a software tool for converting a timing graph to a timing diagram and vice versa.

FIG. 4 illustrates a computer system having software that includes not only a timing analysis or simulation engine 46 but also a conversion tool 48 embodying the timing graph to timing diagram and timing diagram to timing graph conversion methods of the present invention. Conversion tool 48 includes: a node location generator 50 for traversing a timing graph 51; an information extractor and populator 52 for extracting information from the nodes and arcs of a timing graph and, conversely, for populating the nodes and arcs of a timing graph with information; a graphics generator 54 for generating graphical representations of timing diagrams; and a parser and code generator 56 for parsing and interpreting TDML code and for generating TDML code.

A user may initiate and control the execution of simulation engine 46 and conversion tool 48 in the conventional manner. The computer includes a main memory 58, a central processing unit 60, a fixed disk 62, such as a magnetic hard disk drive or similar data storage device, a removable disk 64, such as a magnetic floppy disk, an optical (CD-ROM or DVD) disk, a magnetic tape cartridge or similar data storage device, a network interface 66, and an input/output interface 68 for communicating with user input/output devices such as a keyboard 70, a video display 72 and a mouse 74. Although not shown for purposes of clarity, in addition to simulation engine 46 and conversion tool 48, the computer system may include any suitable software conventionally included in a computer system, such as a conventional operating system. Furthermore, although the software elements that are principally relevant to the present invention, namely simulation engine 46 and the above-listed elements of conversion tool 48, are shown for purposes of illustration as existing or residing in memory 58, persons skilled in the art to which the invention relates will understand that the software is illustrated in this manner because software is typically executed from such main memory and fetched into the main memory on an as-needed basis from other sources such as disk drive 62 or network interface 66. As such persons will appreciate, these software elements may or may not actually exist simultaneously or in their entirety in memory 58. A program product carrying the above-described software elements may be provided to the computer via removable disk drive 64 or network interface 66. A CD-ROM 76 carrying such a program product readable by removable disk drive 64 is shown for purposes of illustration.

Conversion tool 48 may be integrated with simulation engine 46 or other software or may be a stand-alone product. In an embodiment in which the two are integrated, simulation engine 46 defines, creates and populates an instance of timing graph 51 (i.e., a data structure) in memory 58 in the conventional manner. This instance may be accessed directly by conversion tool 48. Alternatively, conversion tool 48 may create a separate instance of a timing graph.

Figure 5:
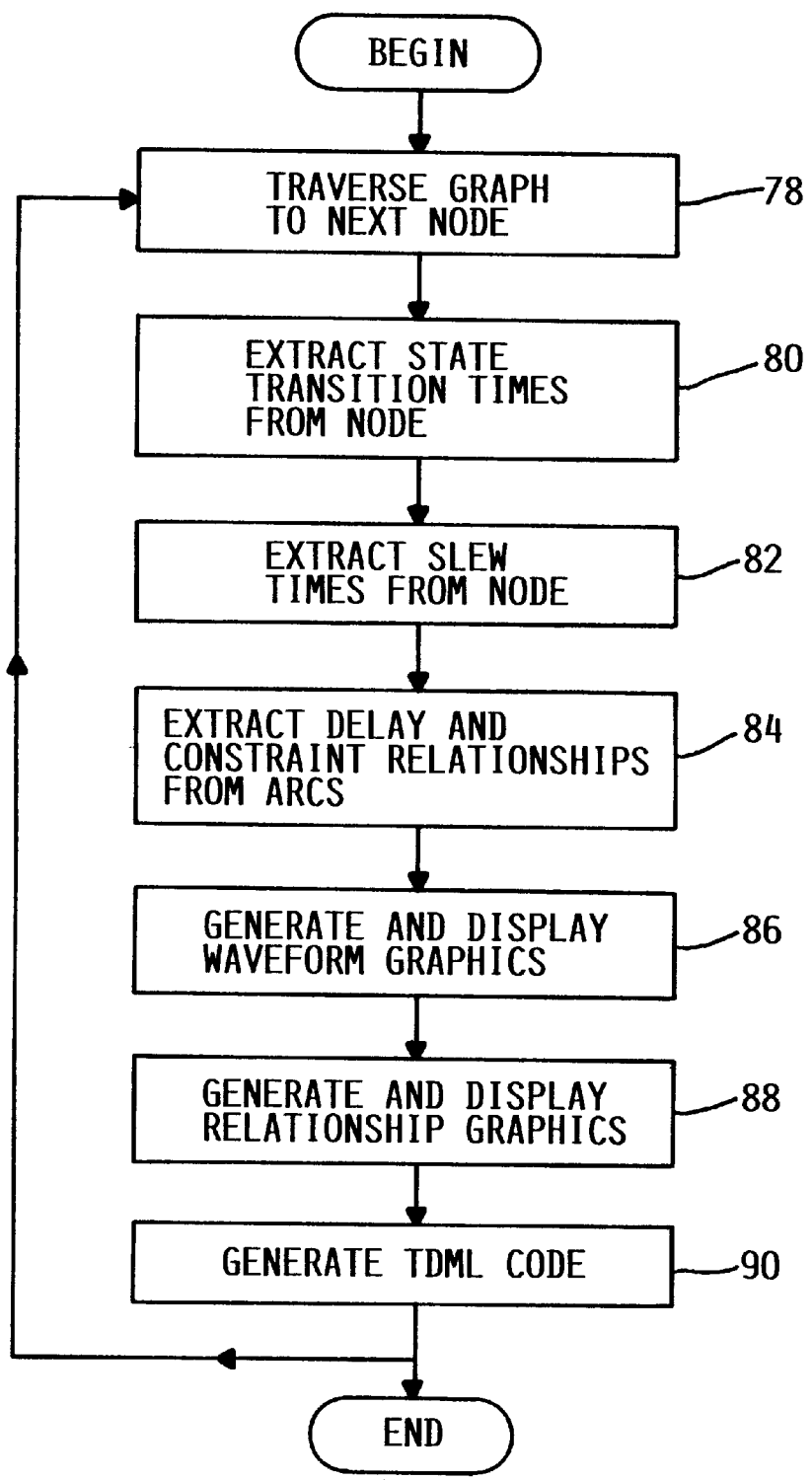
FIG. 5 is a flowchart illustrating a computer-implemented method for converting a timing graph to a timing diagram.

FIG. 5 illustrates an exemplary method for converting a timing graph to a timing diagram that can be performed by the programmed computer system illustrated in FIG. 4. At step 78 node location generator 50, which controls the traversal of timing graph 51, locates the next node at which signal information is to be extracted. As noted above, the algorithms for traversing a timing graph are well-understood by persons skilled in the art and are therefore not described herein. In the example described above with respect to FIG. 3, the timing graph could be traversed, for example, from node 38 to node 34 to node 36.

At step 80 information extractor and populator 52 extracts state transition times from the node. Such information is represented in the example described above with respect to FIG. 3 by the rise and fall times set forth in the boxes relating to the nodes. At step 82 information extractor and populator 52 extracts slew times from the node. Such information is represented in the example described above with respect to FIG. 3 by the rise and fall slew times set forth in the boxes relating to the nodes. At step 84 information extractor and populator 52 extracts constraint relationship information and propagation or delay relationship information from the arc or arcs connected to the node. Such information is represented in the example described above with respect to FIG. 3 by the set-up, hold, and delay times set forth in the boxes relating to the arcs.

At step 86 graphics generator 54 generates graphics representing the waveforms defined by the rise and fall times extracted from the nodes. The graphics may depict the waveforms in the conventional manner illustrated in FIG. 1, with each waveform represented by horizontal lines parallel to the time axis and diagonal lines indicating state transitions. Graphics generator 54 interacts with suitable hardware elements of the computer system to cause the graphics to be displayed on video display 72. Similarly, at step 88 graphics generator 54 generates graphics representing the temporal relationships defined by the set-up, hold and delay times extracted from the arcs. The graphics may depict these relationships in the conventional manner illustrated in FIG. 1, with each relationship represented by a horizontal dimension arrow between two vertical dashed lines representing points in time on the waveforms. Graphics generator 54 interacts with suitable hardware elements of the computer system to cause the relationship graphics to be displayed on video display 72. The resulting composite of the graphics thus may resemble FIG. 1.

In addition, or alternatively, to displaying the timing diagram graphically, at step 90 TDML parser and generator 56 may generate TDML code that represents the timing diagram. Such code can then be recorded on a disc or other medium or transmitted via a network, and remotely reproduced in graphical format by a suitable TDML-enabled browser.

The steps of the illustrated method are then repeated beginning at step 78 until all nodes and arcs of the timing graph have been read. It should be noted that the order of the steps is not critical, and can be performed in other suitable sequences.

Figure 6:
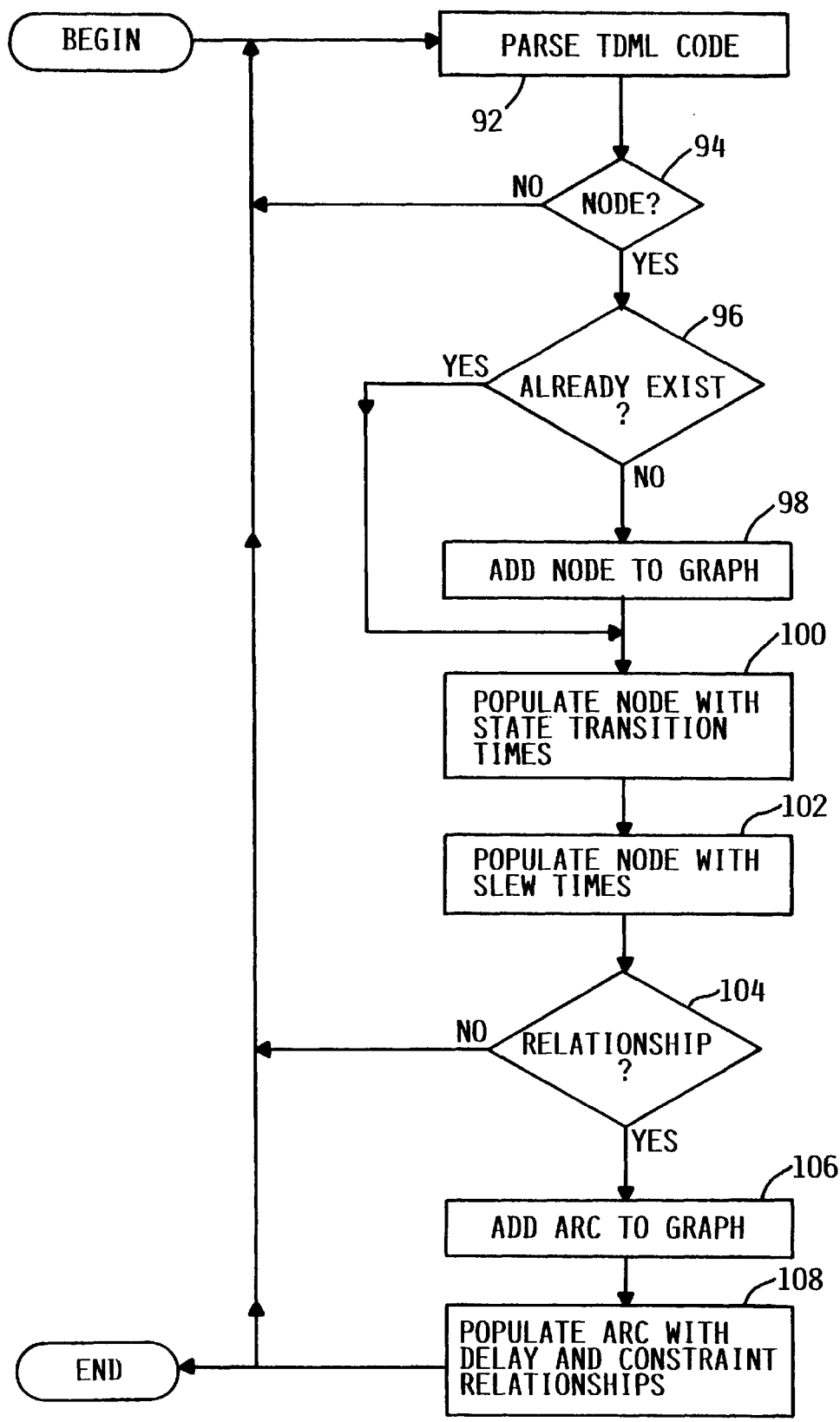
FIG. 6 is a flowchart illustrating a computer-implemented method for converting a timing diagram to a timing graph.

FIG. 6 illustrates an exemplary method for converting a timing diagram to a timing graph that can be performed by the programmed computer system illustrated in FIG. 4. At step 92 TDML parser and generator 56 parses and interprets TDML code that represents a timing diagram. At step 94 it is determined whether the interpretation indicates the existence of a node. If not, then the method returns to step 92. If a node is indicated in the TDML code, then at step 96 it is determined whether the node already exists in the timing graph data structure. If a node exists, then at step 100 extractor and populator 52 stores in the node the state transition times obtained from the TDML code. Such information is represented in the example described above with respect to FIG. 3 by the rise and fall times set forth in the boxes relating to the nodes. If a node does not exist, then one is created at step 98 before proceeding to step 100. At step 102 information extractor and populator 52 stores in the node the slew times obtained from the TDML code. Such information is represented in the example described above with respect to FIG. 3 by the rise and fall slew times set forth in the boxes relating to the nodes. At step 104 it is determined whether the interpretation of the TDML code indicates the existence of a relationship between the signal at the node and a signal at another node or another signal on the same node. If a relationship is not indicated, the method returns to step 92. If a relationship is indicated, then at step 106 an arc is added to the timing graph data structure. At step 108 information extractor and populator 52 stores in the arc constraint relationship information and propagation or delay relationship information obtained from the TDML code. Such information is represented in the example described above with respect to FIG. 3 by the set-up, hold, and delay times set forth in the boxes relating to the arcs.

The steps of the illustrated method are then repeated beginning at step 92 until all waveforms and relationships of the timing diagram have been read. It should be noted that the order of the steps is not critical, and can be performed in other suitable sequences.

The invention can be used by a circuit design engineer, for example, to simulate circuits using timing diagrams obtained electronically in TDML or similar format via a network such as the Internet. As described above, the invention can convert the TDML timing diagram into a timing graph or populate an existing timing graph created by a simulation engine. The simulation engine then performs the simulation and, accordingly, updates the timing graph to reflect the results of the simulation. The invention can then be used to convert the timing graph into a timing diagram that can be displayed on a video monitor for the user to evaluate.

It will be evident that there are numerous embodiments of the present invention, which, while not specifically described above, are clearly within the scope and spirit of the invention. Consequently, the above description is considered to be exemplary only, and the full scope of the invention is to be determined solely by the appended claims.

What is claimed is:

1. A computer-implemented method for converting a timing graph produced by a static timing engine into a timing diagram, said timing graph represented by a data structure stored in a computer, said data structure having nodes corresponding to actual circuit nodes of a circuit simulated by said timing engine and arcs connecting said nodes representing temporal relationships, the method comprising the steps of:

traversing said data structure from node to node to identify nodes of a predetermined set of nodes of interest and arcs of a predetermined set of arcs of interest;

extracting from each node of interest data representing a set of state transitions of a signal of said circuit present at an actual circuit node corresponding to said node of interest;

outputting a graphical representation of a plurality of waveforms having said state transitions;

extracting from each arc of interest data representing a set of temporal relationships including state transition relationships between signals of said circuit present at said actual circuit nodes; and outputting a graphical representation of said relationships indicating temporal relationships between points on a first waveform and points on a second waveform defined by operational characteristics of electronic components of said circuit.

2. A computer-implemented method for converting a timing graph produced by a static timing engine into a timing diagram, said timing graph represented by a data structure stored in a computer, said data structure having nodes corresponding to actual circuit nodes of a circuit simulated by said timing engine and arcs connecting said nodes representing temporal relationships, the method comprising the steps of:

traversing said data structure from node to node to identify nodes of a predetermined set of nodes of interest and arcs of a predetermined set of arcs of interest;

extracting from each node of interest data representing a set of state transitions of a signal of said circuit present at an actual circuit node corresponding to said node of interest;

extracting from each arc of interest data representing a set of temporal relationships including state transition relationships between signals of said circuit present at said actual circuit nodes; and generating software code having a syntax defining waveform state transitions and temporal relationships between points on a plurality of waveforms, said code reflecting said set of state transitions extracted from said nodes of interest and said temporal relationships extracted from arcs of interest.

3. The computer-implemented method claimed in claim 2, wherein said code is generated in Timing Diagram Markup Language (TDML).

4. A computer-implemented method for converting a timing diagram into a timing graph for use by a static timing engine in simulating a circuit, the method comprising the steps of:

parsing software code having a syntax defining waveform state transitions and temporal relationships between points on a plurality of waveforms, said code reflecting a set of state transitions of signals at a set of nodes of interest and a set of temporal relationships including state transition relationships between signals of said circuit present at actual circuit nodes of said circuit;

storing data representing said state transitions and data representing said temporal relationships in a data structure in a computer, said data structure having nodes corresponding to said actual circuit nodes and arcs connecting said nodes representing temporal relationships, said data representing said state transitions of a signal at an actual circuit node being stored in one of said nodes, and said data representing said temporal relationships between two signals being stored in one of said arcs.

5. The computer-implemented method claimed in claim 4, wherein said code is Timing Diagram Markup Language (TDML).

6. A computer program product for use in a computer system for converting a timing graph produced by a static timing engine into a timing diagram, said timing graph represented by a data structure stored in said computer system, said data structure having nodes corresponding to actual circuit nodes of a circuit simulated by said timing engine and arcs connecting said nodes representing temporal relationships, said computer program product comprising at least one signal-bearing medium usable by said computer system and carrying thereon:

a node location generator for traversing said data structure from node to node to identify nodes of a predetermined set of nodes of interest and arcs of a predetermined set of arcs of interest;

a transition information extractor for extracting from each node of interest data representing a set of state transitions of a signal of said circuit present at an actual circuit node corresponding to said node of interest;

a waveform graphics generator for outputting a graphical representation of a plurality of waveforms having said state transitions;

a relationship information extractor for extracting from each arc of interest data representing a set of temporal relationships including state transition relationships between signals of said circuit present at said actual circuit nodes; and a relationships graphics generator for outputting a graphical representation of said relationships indicating temporal relationships between points on a first waveform and points on a second waveform defined by operational characteristics of electronic components of said circuit.

7. A computer program product usable in a computer system for converting a timing graph produced by a static timing engine into a timing diagram, said timing graph represented by a data structure stored in said computer system, said data structure having nodes corresponding to actual circuit nodes of a circuit simulated by said timing engine and arcs connecting said nodes representing temporal relationships, the computer program product comprising at least one signal-bearing medium usable by said computer system and carrying thereon:

a node location generator for traversing said data structure from node to node to identify nodes of a predetermined set of nodes of interest and arcs of a predetermined set of arcs of interest;

a transition information extractor for extracting from each node of interest data representing a set of state transitions of a signal of said circuit present at an actual circuit node corresponding to said node of interest;

a relationship information extractor for extracting from each arc of interest data representing a set of temporal relationships including state transition relationships between signals of said circuit present at said actual circuit nodes; and a code generator for generating software code having a syntax defining waveform state transitions and temporal relationships between points on a plurality of waveforms, said code reflecting said set of state transitions extracted from said nodes of interest and said temporal relationships extracted from arcs of interest.

8. The computer program product claimed in claim 7, wherein said code is generated in Timing Diagram Markup Language (TDML).

9. A computer program product usable in a computer system for converting a timing diagram into a timing graph for use by a static timing engine in simulating a circuit, the computer program product comprising at least one signal-bearing medium usable by said computer system and carrying thereon:

a waveform parser for parsing software code having a syntax defining waveform state transitions and temporal relationships between points on a plurality of waveforms, said code reflecting a set of state transitions of signals at a set of nodes of interest and a set of temporal relationships including state transition relationships between signals of said circuit present at actual circuit nodes of said circuit;

a data structure populator for storing data representing said state transitions and data representing said temporal relationships in a data structure in said computer system, said data structure having nodes corresponding to said actual circuit nodes and arcs connecting said nodes representing temporal relationships, said data representing said state transitions of a signal at an actual circuit node being stored in one of said nodes, and said data representing said temporal relationships between two signals being stored in one of said arcs.

10. The computer program product claimed in claim 9, wherein said code is Timing Diagram Markup Language (TDML).

* * * * *